United States Patent [19]

Houk

[11] Patent Number: 5,191,549
[45] Date of Patent: Mar. 2, 1993

[54] METHOD AND APPARATUS FOR PERFORMING A MULTIPLE-INPUT OPTICAL ARITHMETIC COMPARISON

[75] Inventor: Theodore L. Houk, Seattle, Wash.
[73] Assignee: The Boeing Company, Seattle, Wash.
[21] Appl. No.: 700,957
[22] Filed: May 14, 1991

Related U.S. Application Data

[63] Continuation of Ser. No. 287,275, Dec. 21, 1988, abandoned.

[51] Int. Cl.$^5$ ............................................. G06G 9/00
[52] U.S. Cl. ................................. 364/822; 364/769
[58] Field of Search .................. 364/713, 822, 769

[56] References Cited

U.S. PATENT DOCUMENTS

| 3,437,824 | 4/1969 | Lohmann | 250/550 |
| 3,666,359 | 5/1972 | Lee | 350/162.13 |
| 3,680,080 | 7/1972 | Maure | 364/713 X |
| 4,318,581 | 3/1982 | Guest et al. | 364/713 X |
| 4,683,420 | 7/1987 | Goutzoulis | 371/25.1 X |
| 4,797,843 | 1/1989 | Falk et al. | 364/713 |

FOREIGN PATENT DOCUMENTS

0280333 8/1988 European Pat. Off.
0282794 9/1988 European Pat. Off.

OTHER PUBLICATIONS

Knight, G., "Holographic Associative Memory and Processor", Applied Optics, vol. 14, No. 5, May 1975, pp. 1088-1092.
Gschwind, H., et al., Design of Digital Computers, 1975, pp. 68-70.
Tanida, J., et al., "Optical Logic Array Processor Using Shadowgrams", J. Opt. Soc. Am., vol. 73, No. 6, Jun. 1983, pp. 800-809.
Hurst, S. L., "Multiple-valued threshold logic: its status and its realization", Optical Engineering, vol. 25, No. 1, Jan. 1986, Bellingham, Wash., pp. 44-55.

Primary Examiner—Stephen M. Baker
Attorney, Agent, or Firm—Foley & Lardner

[57] ABSTRACT

An optical arithmetic comparator (OAC) is disclosed which is capable of comparing multiple numbers simultaneously, and indicating the common value of the multiple numbers being compared if the numbers are equal. The OAC includes at least two input channels each having a plurality of sources arranged in an identical pattern, the sources being capable of selective activation such that only one source is activated at a time within each of the channels to form a specific spatial light pattern, and a detector array which determines if the specific spatial light pattern indicated the numbers being compared are equal.

22 Claims, 8 Drawing Sheets

FIG. 1

| DECIMAL REPRESENTATION | "2 3 5" RESIDUE REPRESENTATION |
|---|---|
| 0 | 0 0 0 |
| 1 | 1 1 1 |
| 2 | 0 2 2 |
| 3 | 1 0 3 |
| 4 | 0 1 4 |
| 5 | 1 2 0 |
| 6 | 0 0 1 |
| 7 | 1 1 2 |
| 8 | 0 2 3 |
| 9 | 1 0 4 |
| 10 | 0 1 0 |
| 11 | 1 2 1 |
| 12 | 0 0 2 |
| ⋮ | |
| 27 | 1 0 2 |
| 28 | 0 1 3 |
| 29 | 1 2 4 |
| 30 | 0 0 0 |

```
    1              1 1 1
   +2            +0 2 2
   ─              ─────
    3              1 0 3

9              1 0 4
   +3            +1 0 3
   ──             ─────
   12              0 0 2
```

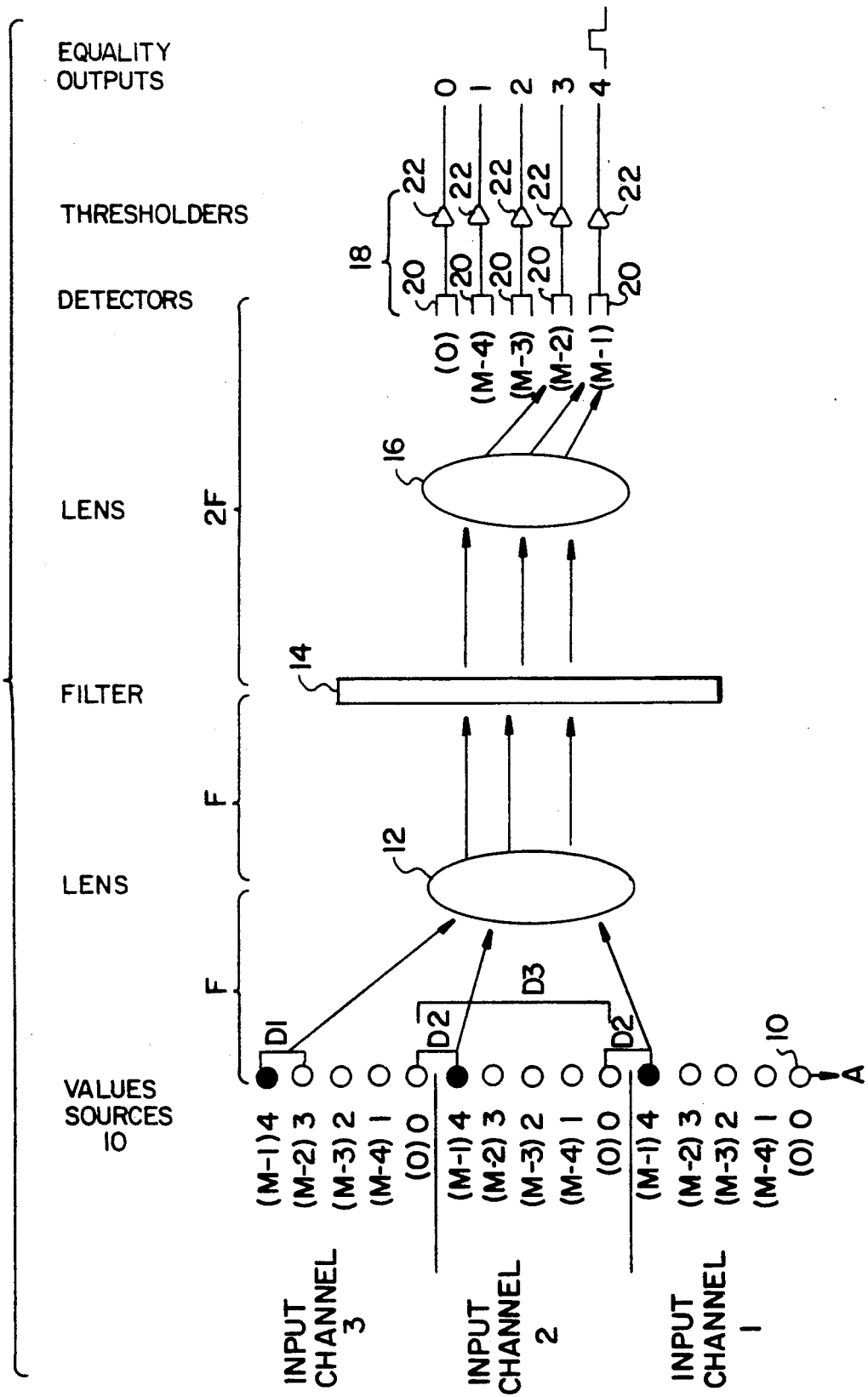

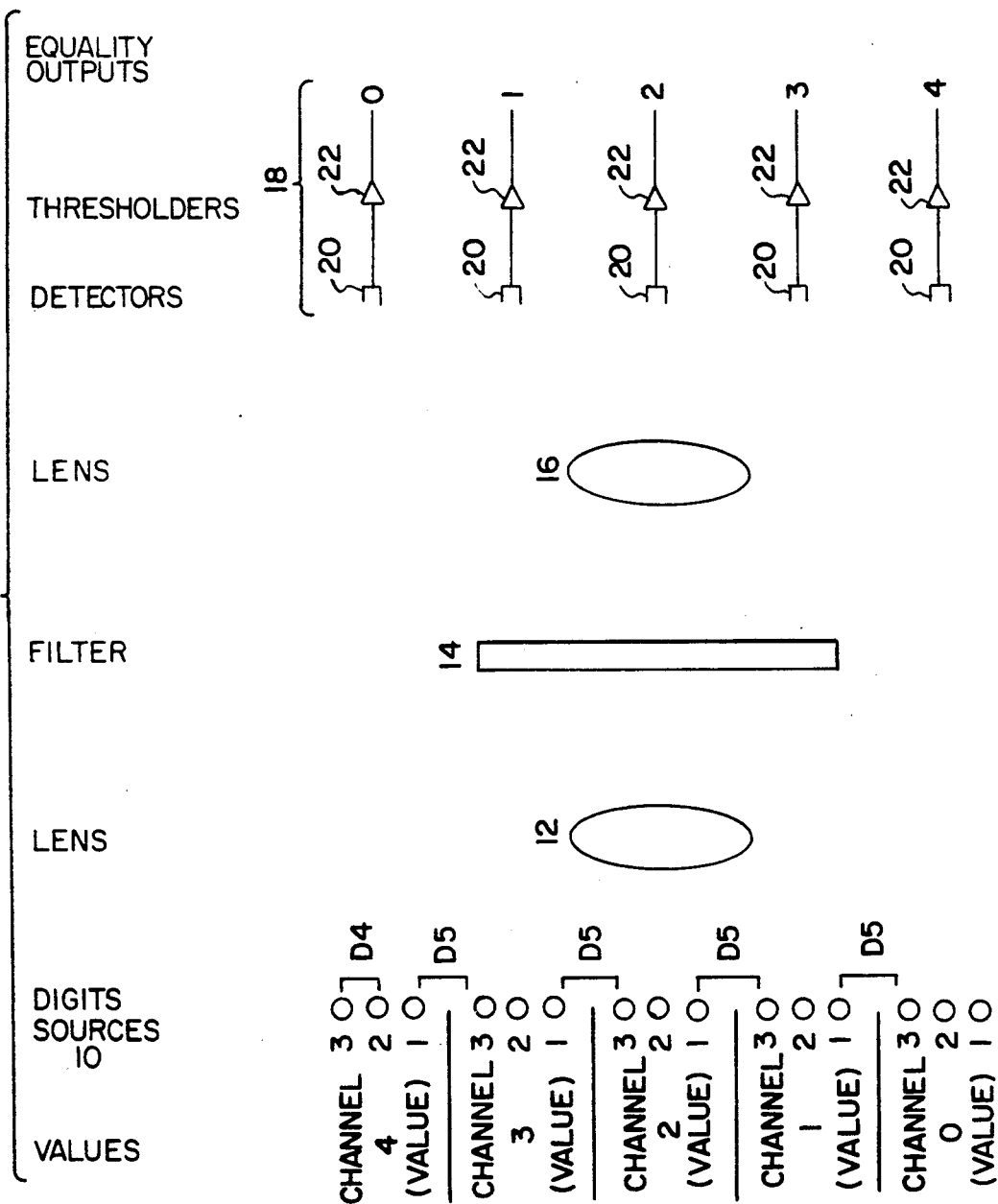

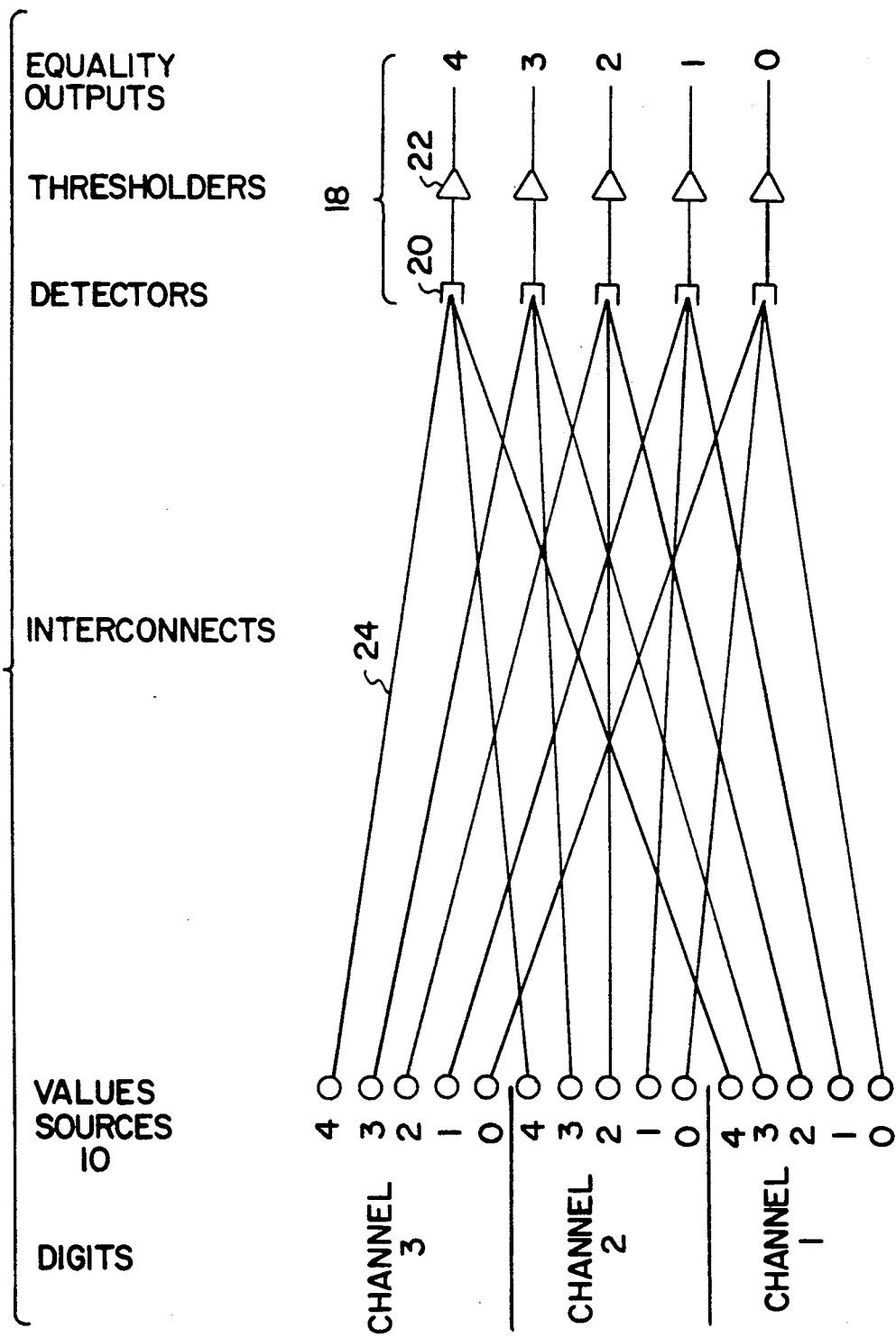

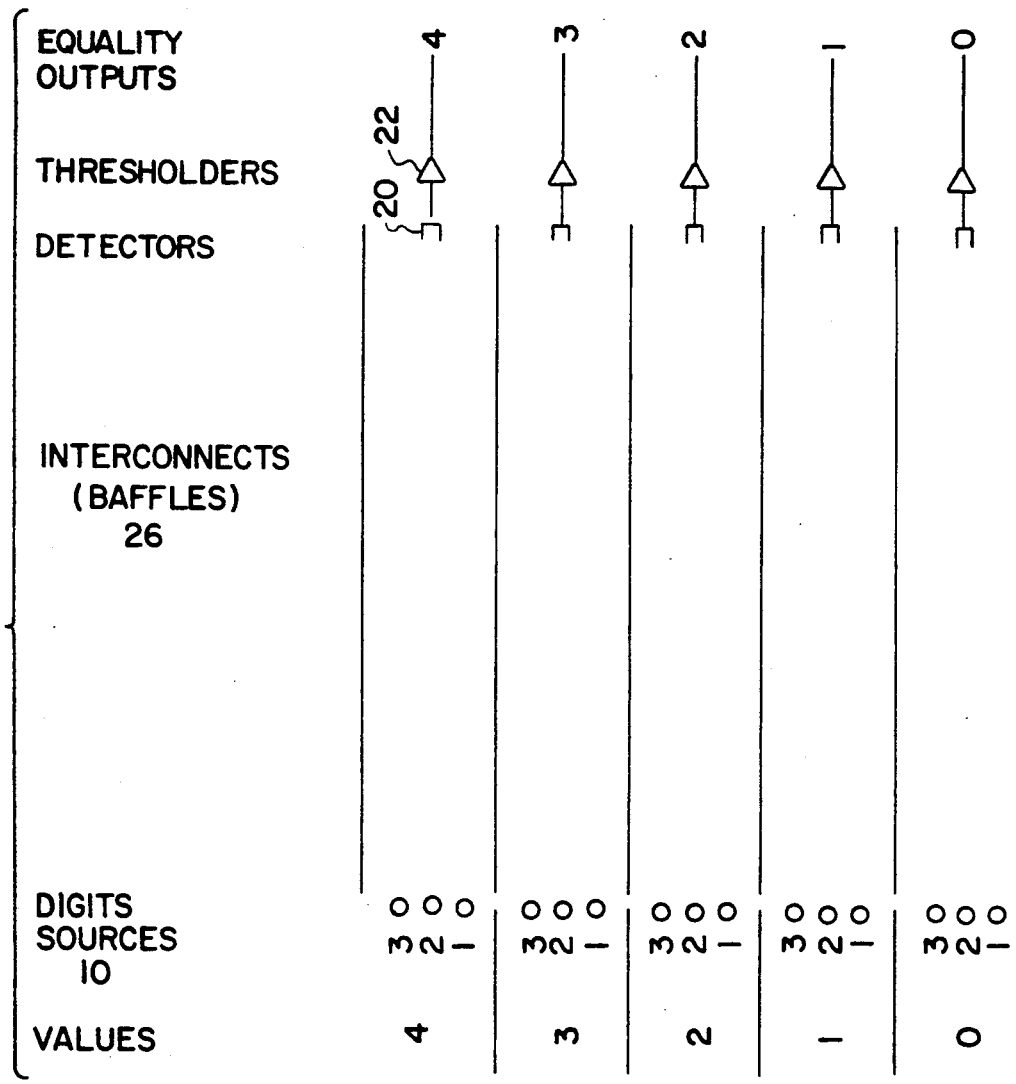

METHOD AND APPARATUS FOR PERFORMING A MULTIPLE-INPUT OPTICAL ARITHMETIC COMPARISON

This application is a continuation of application Ser. No. 07/287,275, filed Dec. 21, 1988, now abandoned.

BACKGROUND OF THE INVENTION

The present invention is related to an optical arithmetic comparator, and more specifically, to an optical comparator and method for comparing multiple digits simultaneously and displaying their common value.

A common task that arises in computing is to show that two or more numbers are equal. A comparison operation of only two numbers can be accomplished by showing that their difference is zero. When more than two numbers are to be compared, however, the method usually utilized is to compare the numbers in pairs and then show that all the pairs are equal via a logical tree.

The above described comparison of more than two numbers takes more than one process step to complete, even in parallel logic, thereby delaying the comparison operation. In addition, the comparison operation is further delayed in conventional electronic computing systems in which the speed is inherently limited by the RC time constants of the interconnecting wiring.

Recent progress in the field of optical computing has led to the demand for optical components, such as optical comparators, capable of overcoming the inherent speed limitations of conventional electronic computing systems. For example, U.S. Pat. No. 4,604,707 issued to Yamashita et al discloses an optical comparator that compares two binary input light patterns. The light patterns are scanned serially by an acoustic wave device in order to effect a bit-by-bit comparison of the input patterns. While providing some advantages over conventional electronic comparators, the speed of the disclosed optical comparator is limited to the speed limitations of the acoustic wave device and still requires multiple comparisons of bit pairs.

SUMMARY OF THE INVENTION

The present invention overcomes the disadvantages and limitations discussed above by providing an optical arithmetic comparator and method for comparing multiple numbers simultaneously. In addition, the optical arithmetic comparator of the present invention is capable of transmitting the common value of the multiple numbers being compared if the numbers are equal.

More specifically, in one preferred embodiment, the invention provides an optical comparator including at least two input channels each having a plurality of sources arranged in an identical pattern, the sources being capable of selective activation such that only one source is activated at a time within each of the channels to form a specific spatial light pattern, and a detector array having a plurality of detectors optically coupled to the plurality of sources via a light transfer system, the plurality of detectors of the detector array being adapted to detect when sources corresponding in pattern location in each input channel are activated simultaneously and to generate an output signal indicative thereof.

In another preferred embodiment, the invention provides an optical comparator including a plurality of input channels each including a plurality of independently controllable light sources arranged in an identical pattern, and a detector array having a plurality of detectors corresponding and optically coupled to the input channels via a light transfer system, the detectors of the detector array being adapted to detect when all of the sources in their corresponding input channel are activated simultaneously and to generate an output signal indicative thereof.

The present invention is particularly applicable to computing systems employing residue arithmetic. Briefly, residue arithmetic does not employ a "carry" operation, that is, each "digit" in the representation is independent of the other. Thus, for example, addition in residue arithmetic of corresponding "digit" in two numbers can effectively be carried out by a device that is not connected to other "digit", but parallel to other digits. In residue arithmetic, each "digit" in a representation of a number is the decimal value of the number module the prime number corresponding to that position, called the "modulus". Addition is the sum of corresponding representations of the number modulo the modulus. FIG. 1 gives examples of residue arithmetic in a "235" representation where 2 is the prime number associated with the left-most modulus, 3 with the central modulus, and 5 with the right-most modulus. Further information concerning residue arithmetic may be found in the text by Szabo and Tanaka entitled, *Residue Arithmetic and Its Applications to Computer Technology*, McGraw-Hill Book Company, New York, 1967.

BRIEF DESCRIPTION OF THE DRAWINGS

Reference should be made to the following figures for a detailed understanding of residue arithmetic discussed above and the preferred embodiments of the invention in which:

FIG. 1 is a table of examples of residue arithmetic in a "235" representation;

FIG. 2 illustrates a first embodiment of the present invention employing pattern recognition using a digit-grouping technique;

FIG. 3 illustrates a second embodiment of the present invention employing pattern recognition using a value-grouping technique;

FIG. 4 illustrates a third embodiment of the present invention employing optical interconnection using the digital grouping technique of FIG. 2;

FIG. 5 illustrates a fourth embodiment of the present invention employing optical interconnection using the value-grouping technique of FIG. 3;

DETAILED DESCRIPTION OF THE PREFERRED EMBODIMENTS

Figure 6A:
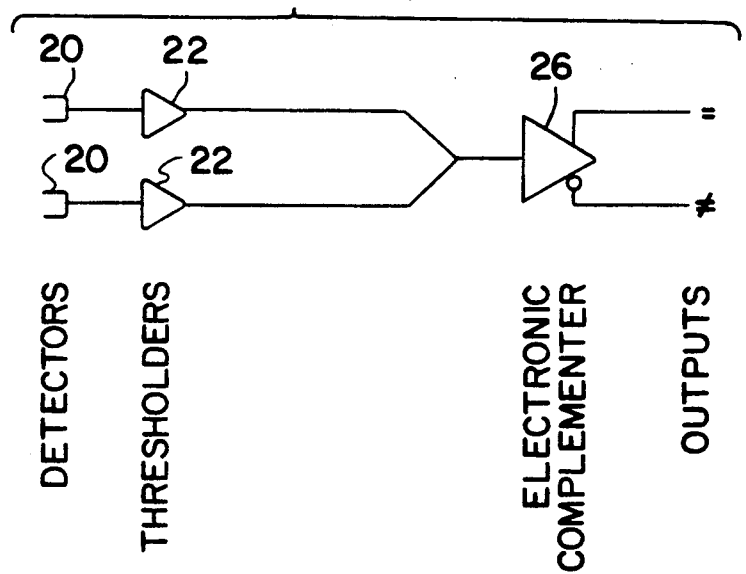
FIGS. 6a and 6b illustrate an electrical and electro-optical complementary output circuit, respectively, that may be employed in the embodiments illustrated in FIGS. 2-5.

The preferred embodiments of the invention will be described with reference to optical arithmetic comparators (OAC) for use in computing systems employing residue arithmetic but is not limited thereto.

Referring now to FIG. 2, a first embodiment of an optical arithmetic comparator according to the present invention is shown including a pattern recognition system employing a "digit-grouping" technique. A plurality of sources 10, which are preferably mutually coherent sources with the same phase and intensity, are provided in a spaced relationship along a plane A. The plurality of sources 10 are grouped into N input channels, where N is the number of digits to be compared, the sources within each input channel being equally spaced by the same distance D1. For example, three input channels (1, 2, 3) representing three digits to be compared are illustrated in FIG. 2. Each of the N digits to be compared is represented in a "one-of-m" format by the grouped sources 10 in each input channel. In the "one-of-m" format, one and only one of the m sources 10 for each input channel is active at a time. The order of the sources from 0 to m−1 is in the same direction (spatial orientation) for each input channel. Thus, the energization of the (m−3) light source 10 for each channel corresponds to the value "2" in each channel. FIG. 2, for example, shows the N=3, m=5 case for three input digits of modulus 5, e.g., N=3, m=5.

The distance D2 from the m−1 source of one input channel to the zero source of the next input can be different from the uniform spacing D1 between the sources in each input channel, but the distance D3 between sources corresponding in pattern location must be uniform. Thus, if the input digits have the same value, the active sources representing the input digits are uniformly spaced at distance D3 between channels for every input value. Recognition of a pattern of equally spaced active sources is determinative of equality of the input digits.

Light from each active source is passed through a Fourier Transform lens 12, having a focal length F and placed one focal length from the sources 10. A Fraunhofer interference pattern is formed on the other side of lens 12 at a distance F therefrom where a filter 14 is positioned. The filter 14 is made to match the interference pattern formed when the input digits are equal, i.e., when activated sources in each channel are equally spaced, in which case the resulting Fraunhofer diffraction pattern is related to a multiple slit interference pattern. Light emerging from the filter 14 passes through a second Fourier Transform lens 16, also having a focal length F and positioned a distance F downstream of filter 14. Light from lens 16 is focussed onto a detector array 18 positioned a distance F downstream of lens 16. Detector array 18 has m detectors 20 and m corresponding threshold circuits 22. The detectors are positioned at a distance of 4F from the plurality of sources 10.

The focused light forms a bright central spot with 2N spots of lesser intensity on either side of the central spot. If the input digits are equal, and if the brightness of each active input source is unity, then the central spot has a brightness proportional to $N^2$. The two nearest spots have brightness proportional to $(N-1)^2$, the next nearest proportional to $(N-2)^2$, and so on to zero brightness.

Each detector 20 (0 to (m−1)) of the detector array 18 is placed at the central spot of the pattern generated by correspondingly valued sources 10 (0 to (m−1)). As shown in FIG. 2, for example, the three input digits each have the value 4 such that the m−1 sources of each channel are activated. The (m−1) detector 20 is placed at the central spot of the pattern generated by the activated (m−1) sources 10 and the corresponding (m−1) threshold circuit 22 generates an output signal which not only indicates that the three input digits are equal, but is indicative of the value (4) of the three input digits.

If one of the input digits is different from the rest, the central spot has a brightness proportional to $(N-1)^2$. Hence, to detect equality of the input digits, the detectors 20 and their associated threshold circuits 22 must be capable of discriminating between signals proportional to $(N-1)^2$ and $N^2$ respectively. The threshold circuit output lines are kept separate if the common value (if any) of the digits is wanted. Otherwise, the threshold circuit output lines may be logically OR-ed together (not shown) to form a common "equality" output.

A second embodiment of the optical arithmetic comparator (OAC) is shown in FIG. 3. As in the first embodiment, each of the N digits to be compared is represented in "one-of-m" format by sources 10 arranged along a straight line. However, the sources 10 are grouped by input value, forming m "value-groups" or channels (0, 1, 2, 3, 4) of N elements each. The sources 10 are uniformly spaced a distance D4 within each channel and the N input digits occur in the same order. FIG. 3 illustrates the N=3, m=5 case for three input digits of modulus 5. If the three input digits are the same, the active sources representing them are all in the same channel with uniform spacing between them.

As in the first embodiment, the sources 10 are viewed with a Fourier optics arrangement of two lenses 12 and 16, a filter 14 and a detector array 18 each spaced apart by the focal lens F. If the spacing between the sources 10 of each channel is uniform, the Fraunhofer interference pattern from the activated sources of each channel will have the same size and hence the same matched filter can be used for detecting equal input values in all channels. The filter output light is focused in the detector and the threshold for detecting equality lies between $N^2$ and $(N-1)^2$ as above.

The second embodiment has two advantages over the first. The Fraunhofer interference has a larger spatial period because the lights which are lit when the input digits are equal are closer together, and the distance between the detectors is also larger because the pattern of illuminated lights shifts more when the common value of the input digits is changed. These factors make aligning the matched filter and the detectors easier, making this embodiment somewhat more practical than the first.

However, the second embodiment has a peculiar property. If all the sources 10 are uniformly spaced, i.e. D4=D5, then some inputs other than the desired "all inputs equal" will have an output proportional to $N^2$ which is focussed at locations in between the "all inputs equal" detector locations. This may be illustrated for the case of three inputs of three values each. If these inputs are arranged in the pattern 222111000 with uniform spacing, then any pattern of three consecutive active sources will have the same spacing and will give the same brightness in the detector plane. In the case presented above, the patterns 222, 221, 211, 111, 110, 100, 000, are equally spaced whereas only 222, 111, 000 represent equal input digits. This property may be eliminated by making the spacing between channels (D5) different from the spacing of the sources within the channels (D4).

Third and fourth embodiments of the present invention are illustrated in FIGS. 4 and 5. In both embodiments, an optical interconnect structure 24 is used in place of the Fourier optics arrangements in the first and second embodiments. The interconnect structure from the sources 10 to the detectors 20, plus the following threshold circuits 22, form an optical analog of an electronic multiple input AND circuit.

Referring to FIG. 4, the third optical interconnect embodiment of an OAC according to the present invention uses the same pattern of sources as the first pattern recognition embodiment above, namely, digit-grouping. The optical interconnections 24 distribute unit amounts of energy from each active source to the appropriate detector 20 and may take the form of optical fibers or optical waveguides formed on substrates. (See for example, MacDonald et al "Hybrid Optoelectronic Integrated Circuit", *Applied Optics*, Vol. 26, No. 5, March 1987.) There is one detector 20 for each output value. The interconnect system has enough bound modes to preclude exciting radiation modes with the sources.

If the sources 10 are mutually coherent and have the same intensity, then the same relative brightness levels are found as in the pattern recognition embodiments above. However, incoherent light may be used instead, simplifying the structure of the sources 10. In this case, the light intensities at the detectors 20 are proportional to N when the input digits are equal, proportional to N−1 when one digit is different from the others, and so on down to 0. The detector threshold for detecting equal input digits is set between N and N−1, a tighter specification than when coherent light is used. The possibility of using incoherent light and dispensing with Fourier optics and the matched filter makes this embodiment, in some respects, more compact and commercially practical than the pattern recognition embodiments shown in FIGS. 3 and 4.

The fourth optical interconnect embodiment of the OAC shown in FIG. 5, uses the same pattern of sources as the second pattern recognition embodiment above, namely, value-grouping. The interconnect system here involves no crossovers of one path by another, and therefore could be made from light-tight baffles 26 to prevent light from one channel from reaching the detectors 20 associated with another channel. In cases where the sources 10 can be placed directly on the detector input aperture, and the detector uniformity is good enough to provide reliable discrimination between N active sources and N−1 active sources, then a system requiring minimal components can be constructed.

Figure 6B:
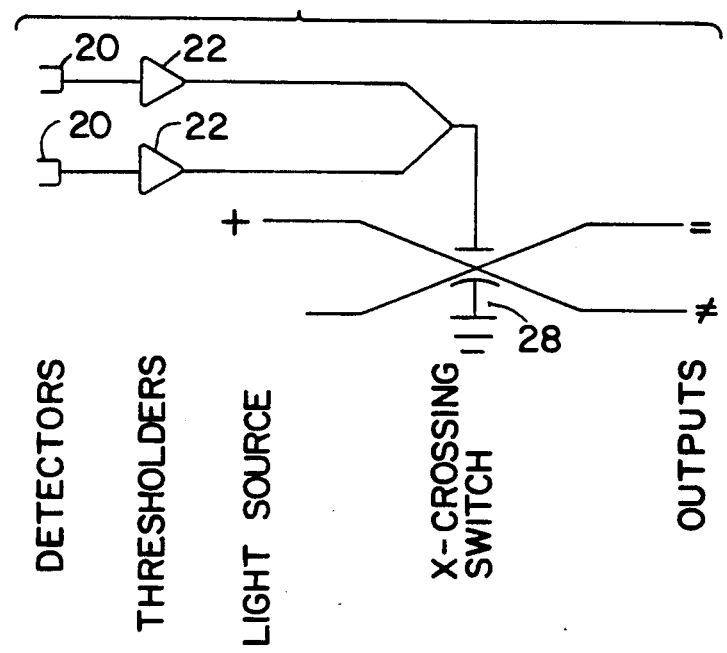

Most of the possible OAC input patterns will not activate any OAC output signal, and it may be desirable in some computing systems to provide a "no equality" signal. Two possible means for doing this are illustrated in FIGS. 6a and 6b. First, the outputs of the threshold circuits in each of the above embodiments are logically OR'ed together. The resulting common signal is applied to a complementing device 26 which provides two outputs, "equality" and "no equality". An electronic complementer is illustrated in FIG. 6a and may include, for example, a TTL SN74265. An electro-optic complementer is illustrated in FIG. 6b as an optical X-crossing switch 28 driven by the OR'ed signals. A discussion of x-crossing switches is provided by Neyer et al in the article entitled, "A Beam Propagation Method Analysis of Active and Passing Waveguide Crossings", *Journal of Lightwave Technology*, Vol. LT-3, No. 3, June 1985, the contents of which are hereby incorporated by reference.

The OAC according to the present invention is capable of providing functions other than direct comparison on digits. It can also be used to detect fixed patterns or equalities, for example, in the form x=y+a=z+b by symbolic substitution. The clearest illustration of this is in the "value-grouping" embodiment of the OAC illustrated in FIG. 5, wherein for a=1 and b=2, the input values (sources) are labeled 012 123 234 340 401 (modulus 5 arithmetic). Further, the equalities of the form x=ay=bz can also be handled by symbolic substitution. For a=2 and b=3, the input sources would be labeled xyz=000_123_241_314_432 (modulus 5 arithmetic). Equalities of these two forms combined can also be handled by a similar method.

The OAC is also capable of providing dual functions, as each detector and threshold circuit combination of the optical interconnect OAC embodiments illustrated in FIGS. 5 and 6 form an optical AND gate, which can be operated by binary input logic on the light sources. Each value-group then becomes a logical criterion to be satisfied with an AND event for these sources. Further, one may convert the AND operation to a MAJORITY operation by providing variable threshold circuits and suitably reducing the discrimination threshold. The threshold circuit outputs may still be OR'ed as before. Therefore, the OAC may be used as a general optical AND (or MAJORITY) gate system.

Figure 7:
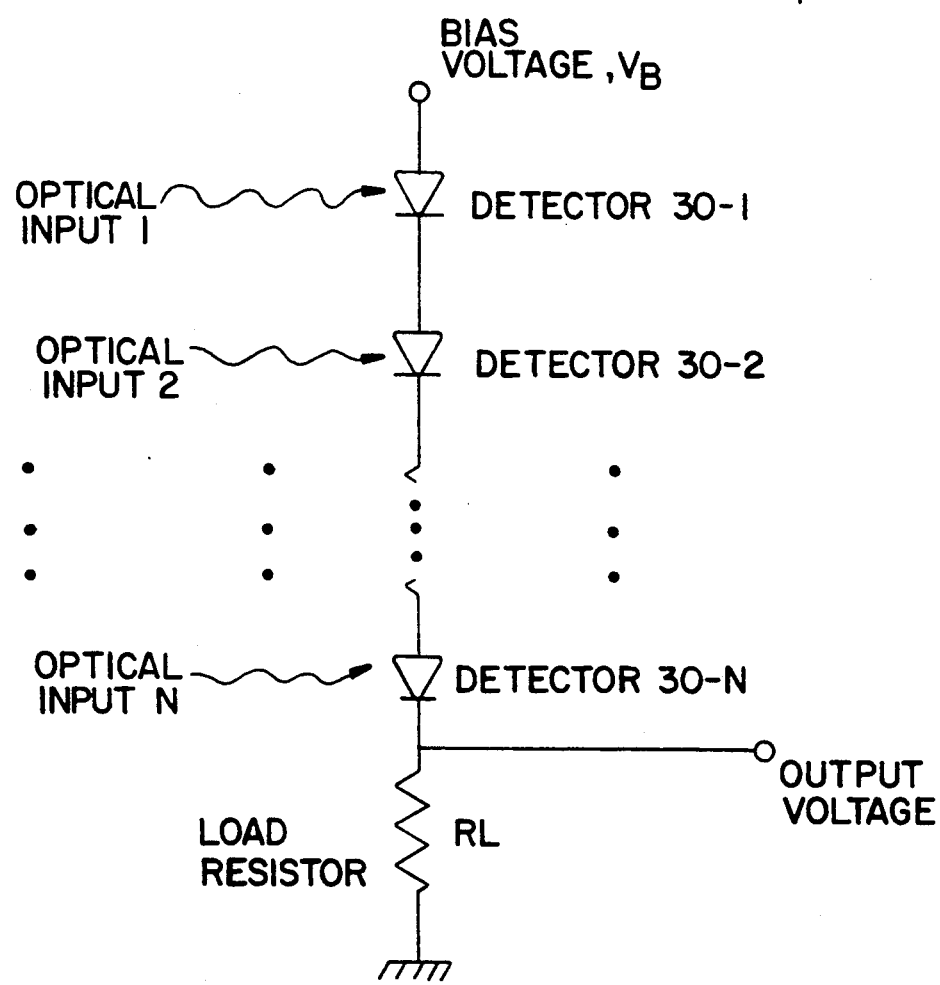
FIG. 7 illustrates a multi-input, optoelectronic AND circuit using photoconductive detectors that may be employed as a detector in the embodiments illustrated in FIGS. 2-5.

An alternate embodiment for each of the detectors 20 and their corresponding threshold circuits 22, illustrated in FIG. 4 for example, is to utilize a multiple-input, opto-electronic AND gate configuration as shown in FIG. 7, wherein photoconductive detectors 30-1 through 30-N are connected in series. A load resistor RL is connected between detector 30-N and ground, and an output terminal 32 is provided between detector 30-N and load resistor $R_L$. The opto-electronic AND gate configuration shown in FIG. 7 replaces, for example, each detector 20 and threshold circuit 22 pair shown in FIG. 4.

The operation of circuit illustrated in FIG. 7 may be considered first in reference to a simple case where N=2. If each detector 30-1 and 30-2 is operated away from saturation, then the resistance can be modeled by $$R_i = \frac{\alpha}{P_I + P_D} \quad (1)$$

where $R_i$ is the detector resistance of detector 30-i, $\alpha$ is a parameter with typical value of 100 ohmswatt, $P_D$ is a dark power (relating to the detector dark current) with typical value of $10^{-7}$ watts and $P_I$ is the input power. The voltage across the load resistor $R_L$ is therefore given by $$V_o = V_B R_L/(R_L + R_1 + R_2) \quad (2)$$

If the load resistor RL is chosen so that when light is present on none or only one of the detectors, the condition $$R_L << R_1 + R_2 \approx \frac{\alpha}{P_D} \quad (3)$$

is true, and when both detectors are illuminated the condition $$R_L >> R_1 + R_2 = \frac{2\alpha}{P_I} \quad (4)$$

is true, then the output voltage will be zero and the bias voltage respectively. Thus, the circuit operates as an AND gate. For the applications of interest, both inputs are of equal value and may be scaled together in magnitude so that conditions 3 and 4 can always be met. For the multi-input AND gate shown in FIG. 7, conditions 3 and 4 become $$R_L << R_1 + R_2 + \ldots R_N \simeq \frac{a}{P_D} \quad (5)$$

$$R_L >> R_1 + R_2 + \ldots R_N = \frac{Na}{P_I} \quad (6)$$

Figure 8:
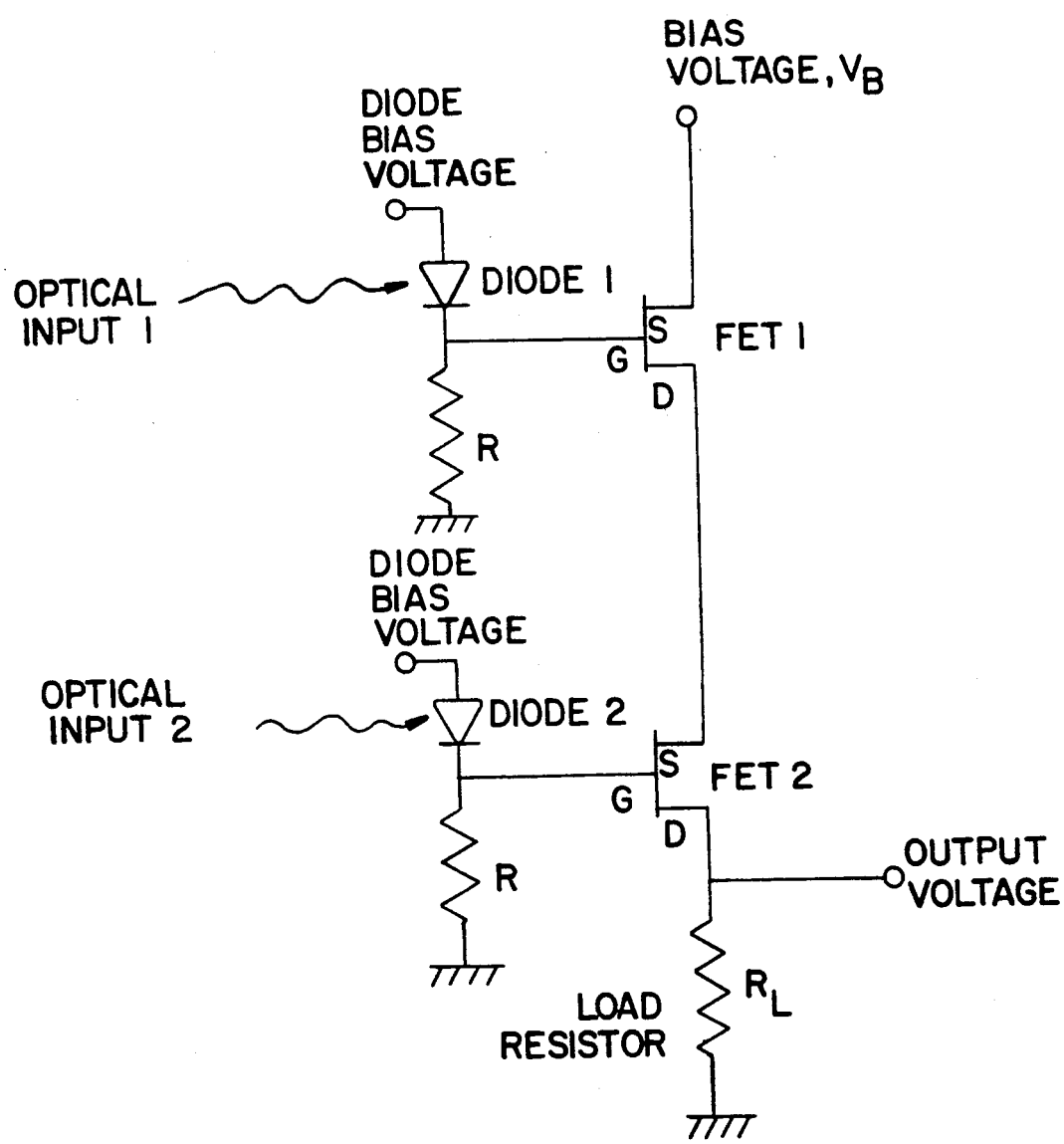
FIG. 8 illustrates an enhancement of the multi-input, opto-electronic AND circuit illustrated in FIG. 7.

For additional gain enhancement, a variation of the circuit of FIG. 7 for two detectors using FETs is illustrated in FIG. 8. The operation of this circuit relies on the variable resistance of the FETs with input voltage and is otherwise similar to the circuit described in FIG. 7. The circuit illustrated in FIG. 8 may be straightforwardly extended for multi-inputs as with the circuit illustrated in Fig. 7. Other variations on both circuits are possible, with the basic operation relying on multiple series resistances that vary with input illumination.

While the invention has been described with reference to preferred embodiments, it is understood that various modifications and improvements may be made by those skilled in the art without departing from the scope of the invention as defined by the appended claims.

What is claimed is:

1. An optical comparator comprising:
   a) at least two input channels each having a plurality of light sources arranged in corresponding identical patterns, said light sources being capable of selective activation such that only one light source is activated at a time within each of said channels to form a specific spatial light pattern;
   b) a detector array having a plurality of detectors corresponding to positions of said light sources; and
   c) a light transfer system disposed between said at least two input channels and said detector array, said plurality of detectors of said detector array and said light transfer system being adapted to detect when a predetermined number of identically positioned light sources corresponding in pattern location in each input channel are activated simultaneously and to generate an output signal indicative thereof, said light transfer system providing one of said detectors with a light intensity level proportional to the square of the number of identically positioned light sources simultaneously active in each of said input channels.

2. An optical comparator as in claim 1 wherein said detector array is adapted to detect when all identically positioned light sources in each input channel are activated simultaneously.

3. An optical comparator as claimed in claim 1, wherein each of said input channels corresponds to a digit to be compared and each of said plurality of light sources within each of said input channels corresponds to the value of said digit.

4. An optical comparator as claimed in claim 3, wherein each of said detectors includes a photodetector, a threshold circuit, and an output line from said threshold circuit, and wherein the output lines of said detectors are arranged in parallel.

5. An optical comparator as claimed in claim 3, wherein said plurality of light sources within each input channel are equally spaced along a straight line and sources of each input channel representing the same value are equally spaced.

6. An optical comparator as claimed in claim 3, wherein each of said detectors includes a photodetector, a threshold circuit, and an output line from said threshold circuit, and wherein the output lines of said detectors are OR'ed together to form a common output line.

7. An optical comparator as claimed in claim 6, further comprising a complementing device coupled to said common output line.

8. An optical comparator as claimed in claim 3, wherein said light sources are coherent light sources.

9. An optical comparator as claimed in claim 8, wherein said light transfer system further comprises a first lens in a first focal plane located one focal length from said plurality of sources, a matched filter located one focal length away from said first lens, and a second lens located one focal length from said matched filter, and wherein said detectors are located one focal length from said second lens.

10. An optical comparator comprising:
    a) a plurality of input channels each including a plurality of independently controllable light sources arranged in an identical pattern;
    b) a detector array having a plurality of detectors; and
    c) a light transfer system disposed between said channels and said detector array corresponding to said input channels, said detector array and said light transfer system being adapted to detect when a predetermined number of said light sources in one of said input channels are activated simultaneously and to generate an output signal indicative thereof, said light transfer system providing a predetermined one of said detectors with a light intensity level proportional to the square of the number of light sources simultaneously active in said one of said input channels.

11. An optical comparator as claimed in claim 10, wherein each of said detectors includes a photodetector, a threshold circuit, and an output line from said threshold circuit, and wherein the output lines of said detectors are arranged in parallel.

12. An optical comparator as in claim 10 wherein said detector array is adapted to detect when all of said light sources within one of said plurality of input channels are activated simultaneously.

13. An optical comparator as claimed in claim 10, wherein each of said detectors includes a photodetector, a threshold circuit, and an output line from said threshold circuit, and wherein the output lines of said detectors are OR'ed together to form a common output line.

14. An optical comparator as claimed in claim 13, further comprising a complementing device coupled to said common output line.

15. An optical comparator as claimed in claim 10, wherein each of said light sources within each of said input channels corresponds to a digit to be compared and each of said input channels corresponds to a value of a digit to be compared.

16. An optical comparator as claimed in claim 15, wherein said light sources are coherent light sources.

17. An optical comparator as claimed in claim 16, wherein said light transfer system further comprises a firs lens in a first focal plane located one focal length from said plurality of sources, a matched filter located one focal length away from said first lens, and a second lens located one focal length from said matched filter, and wherein said detectors are located one focal length from said second lens.

18. An optical comparator as claimed in claim 17, wherein said light sources in each input channel are arranged at equal distances along a straight line and the distance between adjacent sources in two separate channels is not equal to the distance between sources within each input channel.

19. A method of optically comparing a plurality of digits, said method comprising the steps of:
   a) providing at least two input channels each having a plurality of sources arranged in identical patterns;
   b) selectively activating one source within each of said input channels based on the digits to be compared;
   c) providing a detector array having a plurality of detectors;
   d) providing a light transfer system disposed between said at least two input channels and said detector array, said light transfer system providing a predetermined one of said detectors with a light intensity level proportional to the square of the number of identically positioned light sources active in each of said input channels;
   e) detecting with said detector array when a predetermined number of identically positioned light sources in each input channel are activated simultaneously; and
   f) generating an output signal indicative of the detection of simultaneous activation of identically positioned light sources in each input channel in step (d).

20. A method of optically comparing a plurality of digits as set forth in claim 19, wherein the step of generating an output signal includes the step of OR'ing the output of said plurality of detectors to form a common output signal.

21. A method of optically comparing a plurality of digits as set forth in claim 19, further comprising the step of generating a complementary signal from the signal generating in step (e).

22. A method of optically comparing a plurality of digits comprising the steps of:
   a) selectively activating a plurality of independently controllable light sources, provided in a plurality of input channels of an optical comparator in an identical pattern, in accordance with the digits to be compared;
   b) detecting when a predetermined number of said light sources within one of said plurality of input channels are simultaneously activated with a detector array having a plurality of detectors corresponding and optically coupled to said plurality of input channels via a light transfer system, said light transfer system providing said detectors with a light intensity level proportional to the square of the number of light sources simultaneously active within one of said input channels, and generating an output signal indicative thereof.

* * * * *